(12) United States Patent
Ranganathan

(10) Patent No.: US 7,142,036 B2
(45) Date of Patent: Nov. 28, 2006

(54) AMPLIFIER COMPENSATION TECHNIQUES FOR SWITCHED CAPACITOR CIRCUITS

(75) Inventor: Sumant Ranganathan, Sunnyvale, CA (US)

(73) Assignee: Broadcom Corporation, Irvine, CA (US)

( * ) Notice: Subject to any disclaimer, the term of this patent is extended or adjusted under 35 U.S.C. 154(b) by 50 days.

(21) Appl. No.: 10/835,401

(22) Filed: Apr. 30, 2004

(65) Prior Publication Data

US 2005/0046460 A1 Mar. 3, 2005

Related U.S. Application Data

(60) Provisional application No. 60/499,457, filed on Sep. 3, 2003.

(51) Int. Cl.
*G06G 7/19* (2006.01)
(52) U.S. Cl. ..................................... 327/337
(58) Field of Classification Search ................ 327/337, 327/554, 94–96
See application file for complete search history.

(56) References Cited

U.S. PATENT DOCUMENTS 4,531,106 A * 7/1985 Ganesan ..................... 333/173
4,894,620 A * 1/1990 Nagaraj ....................... 327/91

* cited by examiner

*Primary Examiner*—My-Trang Nu Ton
(74) *Attorney, Agent, or Firm*—Sterne, Kessler, Goldstein & Fox P.L.L.C.

(57) ABSTRACT

A system and method are used to maintain a variance in feedback factors of an amplifier between the first and second phases either below a threshold value or within a specified range. The system includes the amplifier and first through third capacitances. The amplifier is coupled between an input node and an output node that operates during first and second phases of operation. The first capacitance is coupled across the amplifier and between the input node and the output node during the first and second phases of operation. The second capacitance is coupled to the input node during the first phase of operation. The third capacitance is coupled to one of the input and output nodes during one or both of the first and second phases of operation.

18 Claims, 4 Drawing Sheets

AMPLIFIER COMPENSATION TECHNIQUES FOR SWITCHED CAPACITOR CIRCUITS

CROSS REFERENCE TO RELATED APPLICATIONS

Figure 1:
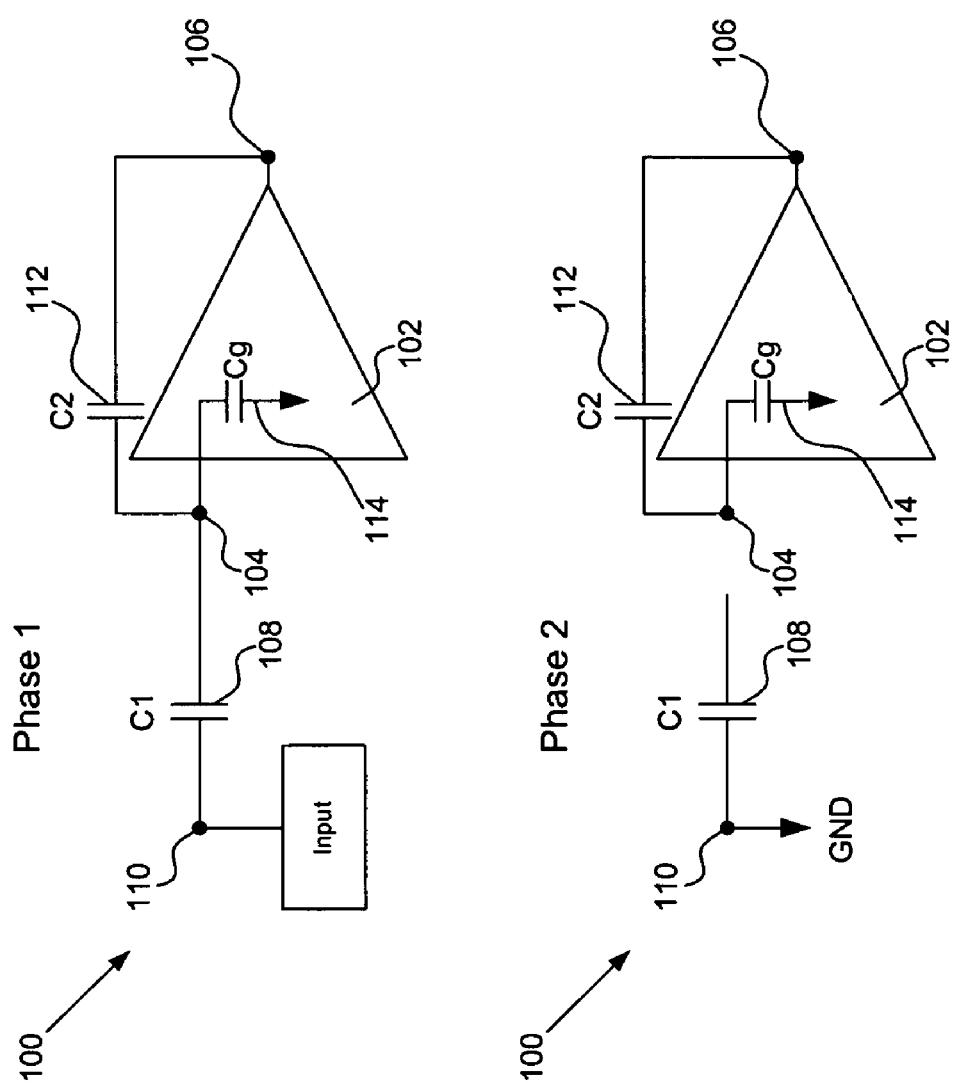

This application claims benefit under 35 U.S.C. §119(e) to U.S. Prov. App. No. 60/499,457, filed Sep. 3, 2003, entitled "Amplifier Compensation Techniques for Switched Capacitance Circuits," which is incorporated herein by reference in its entirety.

BACKGROUND OF THE INVENTION

BACKGROUND ART

Amplifiers used in switched capacitance (SC) circuits usually have first and second feedback configurations of impedance during first (e.g., p1) and second (e.g., p2) phases of operation of the circuit. For example, an input capacitance and a feedback capacitance can be coupled to a virtual ground node during a first phase, while only a feedback capacitance is coupled to the virtual ground node during the second phase. Between phases, a charge from the input capacitance can be received at the virtual ground node, which is deposited on the feedback capacitance just before the input capacitance is de-coupled from the virtual ground node. This typically results in varied feedback factors between the different phases of operation. The feedback factor (ff) is based on which capacitances are coupled to the virtual ground node during a specific phase of operation. Typically:

$$ff1(p1) = \text{Cfeedback}/\Sigma Ci$$

$$ff2(p2) = \text{Cfeedback}/\Sigma Ci$$

In this case, Cfeedback is a capacitance coupled across an input and output terminal of the amplifier and Ci (where i=0, 1, 2, ...) is each capacitance, including Cfeedback and usually an amplifier gate capacitance Cg, coupled to the virtual ground node during a specific phase of operation. The ff corresponds to an attenuation of a signal in a feedback path. Another way of looking at ff is what factor of an output signal is fed back to the input of the amplifier. The amplifier needs to be stable over a wide range of feedback factors, which causes severe constraint on the design of these amplifiers.

A closed loop bandwidth (Fclosedloop) of the amplifier is typically equal to an open loop bandwidth (Fopenloop) of the amplifier times the feedback factor (ff) for each phase. A bandwidth specification (Fspec) for an amplifier is determined based on an application using the amplifier. The amplifier should handle this closed loop bandwidth specification Fspec during all phases of operation. Therefore, an amplifier must meet the following requirements:

$$F\text{closedloop }(p1) = ff1 * F\text{openloop} \geq F\text{spec}$$

$$F\text{closedloop }(p2) = ff2 * F\text{openloop} \geq F\text{spec}$$

This means that the amplifier has to be stable for closed loop bandwidths of both Fspec and (ff2/ff1)*Fspec. However, in conventional systems because ff2 can be much larger than ff1, it may be very difficult to design an amplifier that is stable over this entire range.

Therefore, what is needed is a system and method that reduces a ratio of a ff2 to ff1, so that an overall amplifier is stable for bandwidths of Fspec and (ff2/ff1)*Fspec.

BRIEF SUMMARY OF THE INVENTION

An embodiment of the present invention provides a method including at least the following steps. A first set of capacitances is coupled to an amplifier in a switched capacitance system during a first phase. A second set of capacitances is coupled to the amplifier during a second phase, such that a variance in feedback factors between the first and second phases is either below a threshold value or within a specified range.

Another embodiment of the present invention provides a system including an amplifier and first through third capacitances. The amplifier is coupled between an input node and an output node that operates during first and second phases of operation. The first capacitance is coupled across the amplifier and between the input node and the output node during the first and second phases of operation. The second capacitance is coupled to the input node during the first phase of operation. The third capacitance is coupled to one of the input and output nodes during one or both of the first and second phases of operation.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 1 shows a system having first and second configuration during respective first and second phases of operation.

Figure 2:
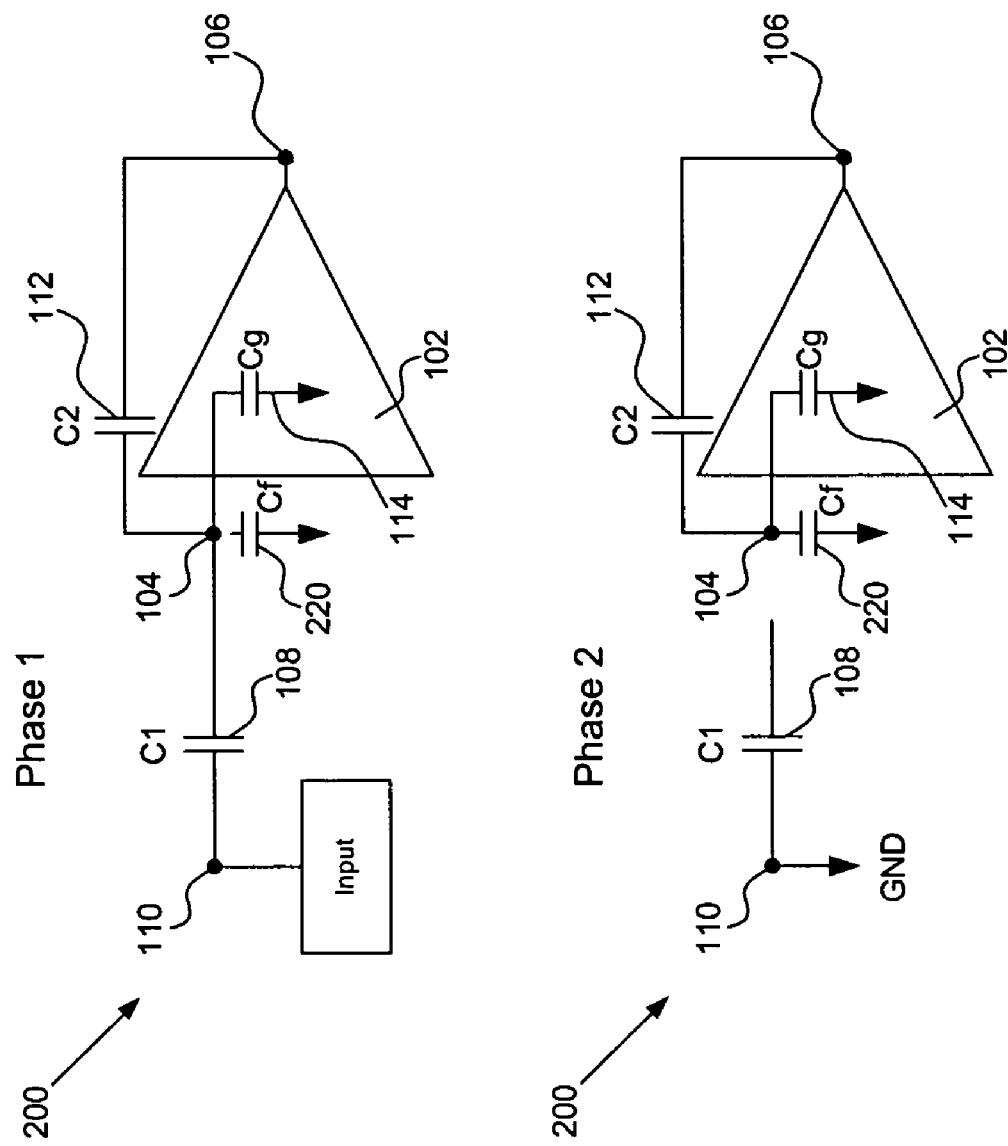
Figure 3:
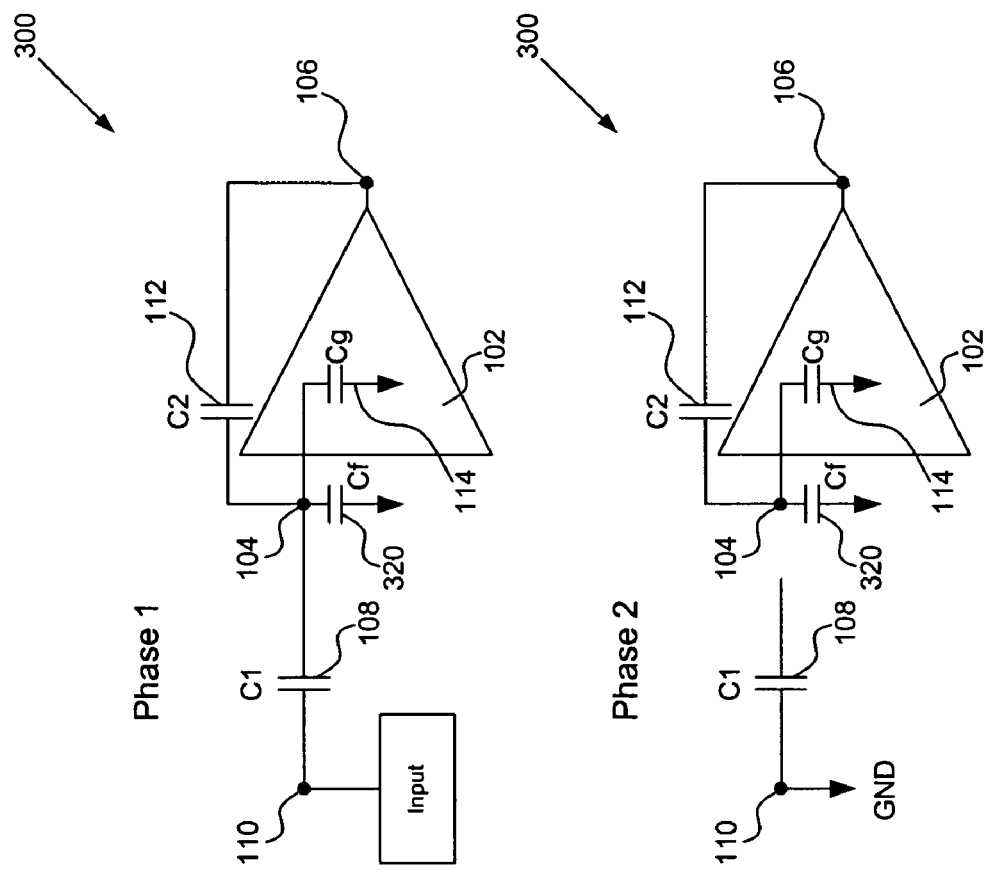
Figure 4:
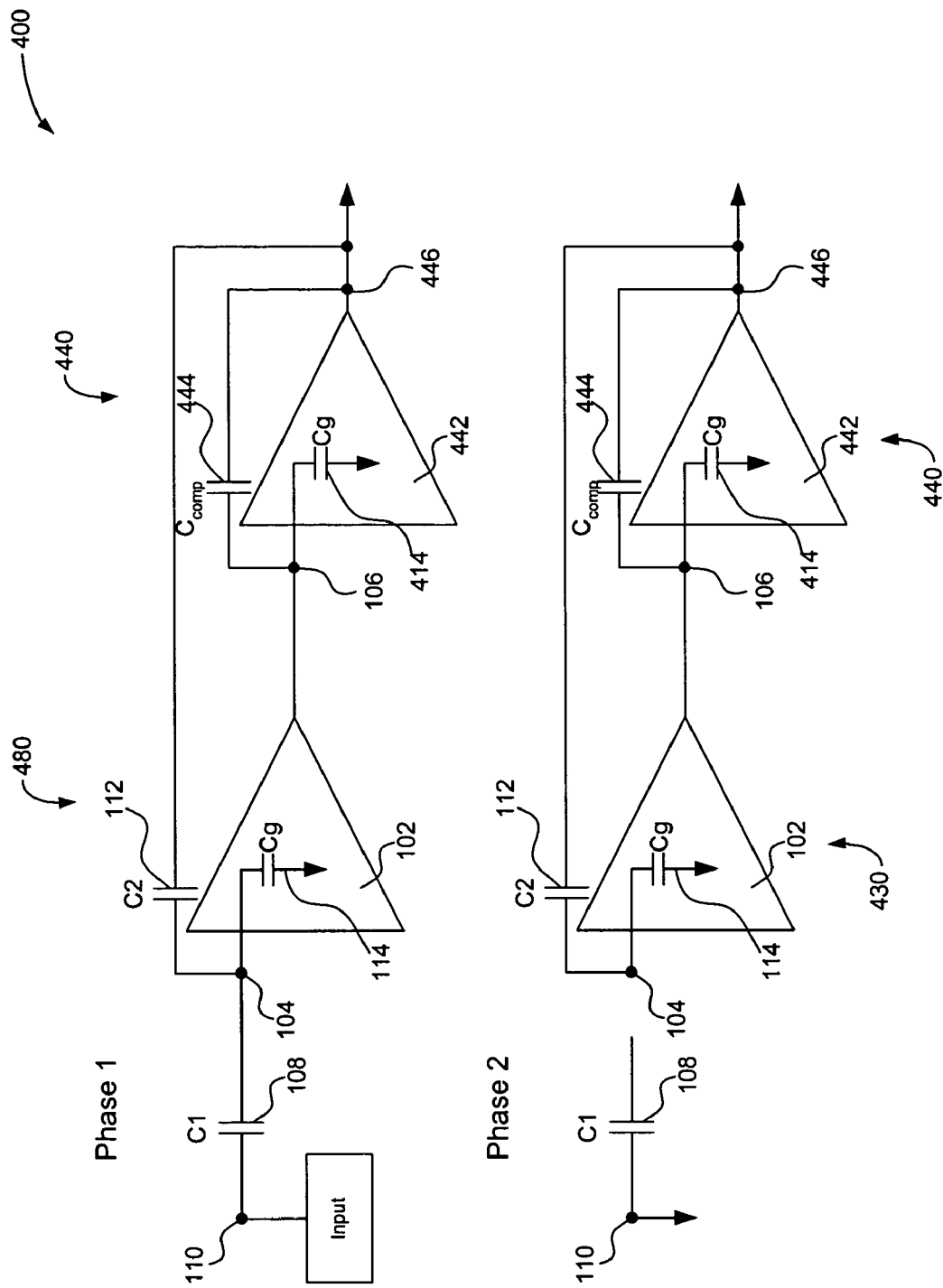

FIGS. 2, 3, and 4 show systems including first and second configurations during respective first and second phases of operation according to various embodiments of the present invention.

The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION OF THE INVENTION

Overview

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

FIG. 1 shows a system 100 having first and second amplifier configurations during respective first and second phases of operation (Phase 1 (P1 or 1) and Phase 2 (P2 or 2). An amplifier 102 (e.g., an operational amplifier) has an input node 104 (e.g., a virtual ground node) and an output node 106. An input signal capacitance C1 108 is coupled between a system input node 110 and node 104. A feedback capacitance C2 112 is coupled across amplifier 102 between nodes 104 and 106. An amplifier internal gate capacitance Cg 114 is also coupled to node 104.

As described above, the closed loop amplifier bandwidth (Fclosedloop) is equal to the open loop amplifier bandwidth (Fopenloop) times a feedback factor (ff) for a specific phase of operation.

In the configuration shown in FIG. 1, the feedback factors for the two phases (ff1 and ff2, assuming a two phase system) are:

$$ff1=C2/(C2+C1+Cg)$$

$$ff2=C2/(C2+Cg)$$

Typically, C1 108 and C2 112 are much larger than Cg 114. The values for C1 108 and C2 112 are typically sized large enough to keep the switched capacitance input noise being added to the input below a given level, which is varies by application. This is especially important in high resolution applications, such as analog-to-digital (AD) converters. In one example the values for elements in system 100 can be as follows:

$$C2=1\,pf,\ C1=2\,pf,\ Cg=0.2\,pf$$

so that $$ff1=1/3.2=0.3125$$

$$ff2=1/1.2=0.833$$

In this example, ff2 is about 2.67 times larger than ff1. With a variance this large it can be difficult to design a stable amplifier 102. Therefore, various configurations of system 100 can be used to reduce this variance, as will be described below with respect to FIGS. 2–4. These configurations are used to allow for a reduction in variance between ff1 and ff2 through introduction of an additional capacitance (e.g., Cf) at node 104 either during one or both phases of operation or an additional capacitances (e.g., Cc) at node 106 that change depending on a phase of operation.

In one example, a variance can be in a range of about 0 to about 3. In another example, the variance can be in a range of about 0 to about 2. In another example the variance can be below a threshold value of about 3. In yet another example, the variance can be below a threshold value of about 2. It is to be appreciated that variances having other ranges or threshold values are contemplated within the scope of the present invention and will depend on an application using the amplifier and the components coupled to the amplifier, as would be apparent to one of ordinary skill in the art upon reading this description.

FIG. 2 shows a system 200 having first and second configurations during respective first and second phases according to an embodiment of the present invention. In this embodiment, a fixed capacitance Cf 220, which can be substantially equal to C1 108, is coupled to node 104 during a second phase (e.g., Phase 2). This is done to maintain substantially the same feedback factor in both phases (i.e., ff2≈ff1), which allows for amplifier 102 to be stable for a single specified bandwidth during both phases of operation. This configuration increases the switched capacitance input noise added to the input because of the additional switching of capacitance Cf 220 to and from node 104 between phases. In order to compensate for this occurring, C1 108 and C2 112 may need to be increased in size.

FIG. 3 shows a system 300 having first and second configurations during first and second clock phases according to a preferred embodiment of the present invention. In the embodiment of FIG. 3, a fixed capacitance Cf 320 is coupled between node 104 and ground during both phases of operation. This is done to reduce the variation between feedback factors ff1 and ff2. In this embodiment, the feedback factors for the two phases (assuming a two phase system) are:

$$ff1=C2/(Cf+C2+C1+Cg)$$

$$ff2=C2/(Cf+C2+Cg)$$

Using the example values from FIG. 1 and using Cf=1 pf, the values for the feedback factors are:

$$ff1=1/4.2=0.24$$

$$ff2=1/2.2=0.45$$

Thus, in this embodiment using these example values, ff2 is about 1.87 times the value of ff1, or about 30% lower than FIG. 1. This is a more manageable range in which to keep the amplifier 102 stable as compared to FIG. 1. Also, as compared to FIG. 2, a noise penalty caused by additional switching elements adding to the switch capacitance input noise is avoided because there are no extra switching elements needed since Cf 320 is coupled to node 104 during both phases of operation.

The value of Fopenloop in system 300 may be little larger compared to the value in FIG. 1 to compensate for a lower first phase feedback factor due to the addition of Cf in the first phase. For example, using the values discussed, ff1 in FIG. 1 is about 1.3 times larger than ff1 in FIG. 3. However, getting slightly extra open loop bandwidth can be easier to achieve and more desirable than making the amplifier stable over a large Fclosedloop range.

In this example, the value for Cf 320 in FIG. 3 is substantially less (about half) that the value for Cf 220 in FIG. 2. This can allow for reduced chip area and power consumption for system 300 compared to system 200.

FIG. 4 shows an amplifier configuration 400 during two clock phases according to an embodiment of the present invention. In this configuration, the amplifier configuration 400 includes first and second stages 430 and 440. Second stage 440 includes an amplifier 442 having a compensation capacitance Ccomp 444 coupled from an input node 106 to an output node 446 and a gate capacitance Cg 414 coupled to node 106. In this embodiment, a value of compensation capacitance Ccomp 444 is variable and the value is adjusted during each phase of operation so that Fclosedloop of the overall amplification system between both phases of operation are substantially equal.

In this embodiment, the first stage 430 has a Gm (transconductance), such that:

$$Fopenloop=Gm(\text{first stage})/Ccomp$$

In this embodiment a value of Ccomp 444 is changed between phases to account for change in ff between phases. Thus if C1 is removed from virtual ground node 104, Ccomp 444 is adjusted to compensate.

It is to be appreciated that any of the amplifiers discussed can include any amount of stages desired based on an application being used without departing from the scope of the present invention. It is also to be appreciated that the amplifiers can be single ended or differential without departing from the scope of the present invention.

It is to be appreciated that an alternative embodiment to those described above may be used during which more than two phases of operation are desired for a particular application, which is contemplated within the scope of the present invention. In this embodiment, the same or different numbers or configurations of capacitors will be used, based on the particular application.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A system, comprising:
   an amplifier coupled between an input node and an output node that operates during first and second phases of operation;
   a first capacitance coupled across the amplifier and between the input node and the output node during the first and second phases of operation;
   a second capacitance coupled to the input node during the first phase of operation; and
   a third capacitance that is uncoupled to the output node during both the first and second phases and that is coupled between the input node and ground during one or both of the first and second phases of operation.

2. The system of claim 1, wherein when the third capacitance is coupled to the input node only during the second phase of operation, a capacitance value of the third capacitance is substantially the same as a capacitance value of the second capacitance.

3. The system of claim 1, wherein:
   when the third capacitance is coupled to the output node,
     during the first phase of operation the third capacitance has a first value,
     during the second phase of operation the third capacitance has a second value, and
     the first and second values produce substantially the same closed loop bandwidth for the amplifier during the first and second phases of operation, such that feedback factors for the amplifier in each phase are substantially equal.

4. The system of claim 1, wherein the amplifier is a single-stage amplifier.

5. The system of claim 1, wherein the amplifier is a multi-stage amplifier.

6. The system of claim 1, wherein a difference in feedback factors between the first and second phases of operation is one of below a threshold value or within a specified range.

7. A system, comprising:
   an amplifier coupled between an input node and an output node that operates during first and second phases of operation;
   a first capacitance coupled across the amplifier during the first and second phases of operation;
   a second capacitance coupled to the input node during the first phase of operation; and
   a third capacitance that is uncoupled to the output node during both the first and second phases and that is coupled between the input node and ground during the second phase of operation.

8. The system of claim 7, wherein the second and third capacitances have substantially the same capacitance value.

9. The system of claim 7, wherein the amplifier comprises an internal gate capacitance coupled to the input node.

10. The system of claim 7, wherein a difference in feedback factors between the first and second phases of operation is one of below a threshold value or within a specified range.

11. A system, comprising:
    an amplifier coupled between an input node and an output node that operates during first and second phases of operation;
    a first capacitance coupled across the amplifier during the first and second phases of operation;
    a second capacitance coupled to the input node during the first phase of operation; and
    a third capacitance that is uncoupled to the output node during both the first and second phases and that is coupled between the input node and ground during the first and second phases of operation.

12. The system of claim 11, wherein the third capacitance has a lower capacitance value than the second capacitance.

13. The system of claim 11, wherein the third capacitance has a value that is about half of the capacitance value of the second capacitance.

14. The system of claim 11, wherein the amplifier comprises an internal gate capacitance coupled to the input node.

15. The system of claim 11, wherein a difference in feedback factors between the first and second phases of operation is one of below a threshold value or within a specified range.

16. A system, comprising:
    a two-stage amplifier coupled between an input node and an output node that operates during first and second phases of operation;
    a first capacitance coupled across a first stage of the two-stage amplifier during the first and second phases of operation;
    a second capacitance coupled to the input node during the first phase of operation; and
    a third capacitance coupled across a second stage of the two-stage amplifier during the first and second phases of operation, the third capacitance being an adjustable variable capacitance.

17. The system of claim 16, wherein a difference in feedback factors between the first and second phases of operation is one of below a threshold value or within a specified range.

18. The system of claim 16, wherein the adjustable variable capacitance of the third capacitance is adjusted during each of the first and second phases of operation so that a closed loop bandwidth during each phase of operation remains substantially equal.

* * * * *